United States Patent [19]

Scheppele

[11] 4,234,357
[45] Nov. 18, 1980

[54] PROCESS FOR MANUFACTURING EMITTERS BY DIFFUSION FROM POLYSILICON

[75] Inventor: James E. Scheppele, Garden Grove, Calif.

[73] Assignee: TRW Inc., Los Angeles, Calif.

[21] Appl. No.: 57,694

[22] Filed: Jul. 16, 1979

[51] Int. Cl.$^3$ ............................................... H01L 7/00
[52] U.S. Cl. .................................... 148/1.5; 148/187; 148/188; 29/571
[58] Field of Search ..................... 148/1.5, 187, 188; 29/571

[56] References Cited

U.S. PATENT DOCUMENTS

| | | | |
|---|---|---|---|
| 3,807,038 | 4/1974 | Watari et al. | 148/187 X |
| 3,912,557 | 10/1975 | Hochberg | 148/187 |
| 3,929,529 | 12/1975 | Poponiak | 148/1.5 X |
| 4,074,304 | 2/1978 | Shiba | 148/187 X |
| 4,104,090 | 8/1978 | Pogge | 148/175 |

Primary Examiner—G. Ozaki
Attorney, Agent, or Firm—Martin R. Horn

[57] ABSTRACT

A process for forming a semiconductive device in which after a base region has been formed, a layer of polysilicon is deposited over the region. A protective covering, such as silicon nitride, is formed over areas of the polysilicon which overlay selected emitter sites and base contact sites. The protective covering prevents the replacing of the unprotected polysilicon with a dielectric such as silicon dioxide. The step of replacing the unprotected polysilicon is performed in one embodiment by a series of steps such as etching to remove the unprotected polysilicon and depositing silicon dioxide where the polysilicon was removed. In another embodiment, the unprotected polysilicon is first subjected to an electrolytic hydrofluoric solution, and then oxidized directly into silicon dioxide.

If the polysilicon originally deposited was not doped with a conductivity-determining impurity, such an impurity may be ion-implanted into the remaining polysilicon. The polysilicon overlaying the base contact sites is removed to expose a portion of the base diffusion region. The conductivity-determining impurity is then diffused into the emitter site to form an emitter suitably protected by the overlaying polysilicon and electrically separated from a base contact site by silicon dioxide.

12 Claims, 7 Drawing Figures

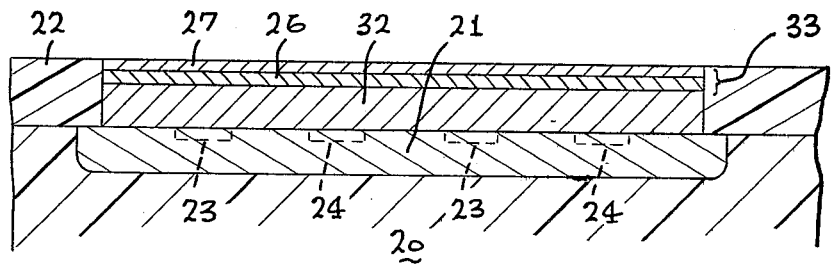
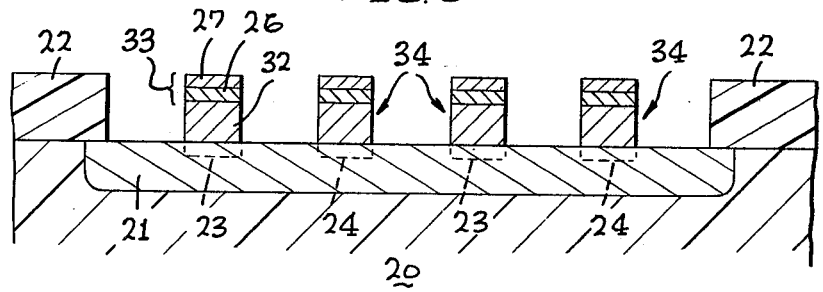
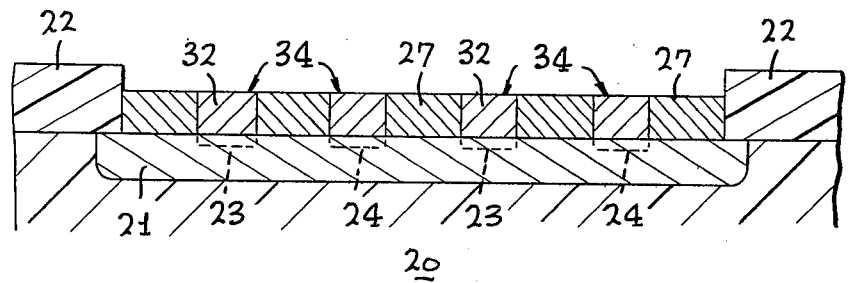
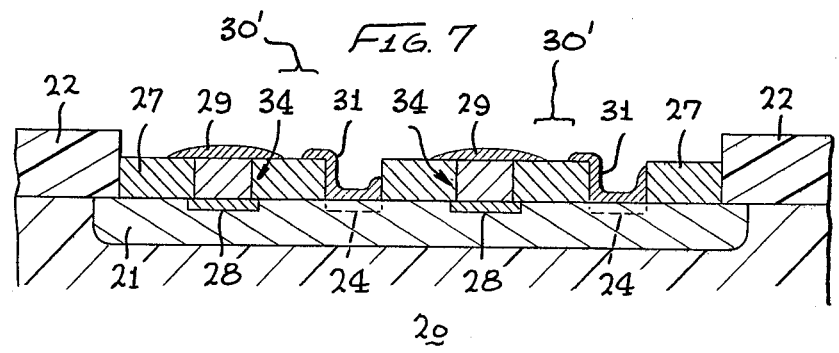

PROCESS FOR MANUFACTURING EMITTERS BY DIFFUSION FROM POLYSILICON

BACKGROUND OF THE INVENTION

1. Field of the Invention

This invention relates to a method for forming an emitter in a semiconductor device by diffusing a conductivity-determining impurity from a polysilicon "island" surrounded by a dielectric into an underlying, previously formed base region.

2. Prior Art

A commonly used process for forming an emitter in a semiconductor device is to provide polysilicon having an impurity of a conductivity-determining nature over a designated emitter site. (Solely for convenience of terminology, the portion of polysilicon overlying an emitter or base contact site is referred to as an "island". Depending on the shape of the site, the overlying polysilicon may be insular, peninsular, or otherwise shaped.) By controlled heating of the device, the impurities diffuse from the polysilicon into the underlying site to form a semiconductive region suitable for use as an emitter. Usually, the polysilicon over the emitter site will be left in place after the emitter is diffused to protect the emitter and also provide a suitable surface for use in forming an electrical connection to the emitter.

The usual method for defining polysilicon over an emitter site has been to form, in a series of steps, silicon dioxide or other suitably high-dielectric material over the portions of the wafer which will not be used for emitter sites. Polysilicon is then deposited over the exposed portions of the wafer and etched to remove it from undesired areas. After diffusion of impurities from the polysilicon overlying the emitter site into the wafer, suitable formation of ohmic contacts and metallization is then performed.

The problem with such a procedure is that the metallization step may cause a short between the contact to the base region and the polysilicon over the emitter site, preventing the proper functioning of the device. Such shorts are a result of the failure of the polysilicon etching step to remove all the polysilicon over the silicon dioxide around the emitter site polysilicon. Similarly, the subsequent metallization, given current etching techniques, cannot be precisely registered over the exposed portion of the base region to which electrical contact is desired. The metal being deposited over that exposed base region may itself be deposited over a portion of the silicon dioxide separating the emitter site from the base contact site. If the metal deposited over the base contact site is also deposited over that portion of the emitter polysilicon on the separating silicon dioxide, a direct short results.

Accordingly, it is an object of the herein disclosed invention to reduce the likelihood of an emitter-base short in a semiconductor device in which an emitter is formed from an overlaying polysilicon island.

It is a further object to more precisely determine the polysilicon island over an emitter site, thereby better separating the potential areas of shorting between an emitter and base.

Additionally, it is an object to provide for an emitter diffusion in which a conductivity-determining impurity may be incorporated into either a doped polysilicon layer or the impurity may be implanted into a previously deposited polysilicon layer, thereby permitting greater control of the electrical properties of an emitter.

SUMMARY OF THE INVENTION

These and other objects are met in the herein disclosed invention by a process wherein a polysilicon layer is deposited over a base region. In one embodiment, the polysilicon layer is then etched to form islands of polysilicon over the desired emitter sites and portions of the base region to which electrical contacts are desired. The portions of the base region not protected by the polysilicon are then covered by a layer of silicon dioxide. The polysilicon material over the base contact regions are then etched away, leaving polysilicon over the designated emitter sites. These islands of polysilicon are well defined and are maximally separated from the base contact regions. If the polysilicon was not doped with a conductivity-determining impurity when it was deposited, such an impurity may then be introduced into the polysilicon islands, e.g., by ion implanting. The device is then heated, causing the conductivity-determining impurity to diffuse into the region under the polysilicon islands, thereby forming a suitable emitter which is protected by the overlaying polysilicon.

In another embodiment of the invention, the polysilicon layer is protected by a mask over the designated emitter and base contact sites, and the exposed polysilicon is subjected to an electrolytic hydrofluoric solution, allowing it to be easily oxidized in a subsequent oxidation step. In this manner, rather than etching away the polysilicon layer and depositing silicon dioxide, portions of the polysilicon layer are directly converted into silicon dioxide.

BRIEF DESCRIPTION OF THE DRAWINGS

FIG. 4 is a diagrammatic side sectional view of a device manufactured in accordance with one embodiment of the herein disclosed invention, whereby layers of polysilicon, silicon nitride, and deposited silicon oxide have been placed over a base diffusion region.

FIG. 5 continues one embodiment of the inventive processing steps, whereby the configuration illustrated in FIG. 4 has been suitably etched to create islands of polysilicon over the desired base contact sites and emitter sites.

FIG. 6 is a side sectional view of the device illustrated in FIGS. 5 and 4, whereby silicon dioxide has been grown or deposited around the islands of polysilicon in accordance with one embodiment of the inventive process.

FIG. 7 continues one embodiment of the inventive process, whereby the device illustrated in FIGS. 4, 5 and 6 have had the polysilicon over the base contact areas etched away, the emitters diffused, and metallization performed without causing a short between the base and emitter.

DETAILED DESCRIPTION OF THE PREFERRED EMBODIMENT

Figure 1:
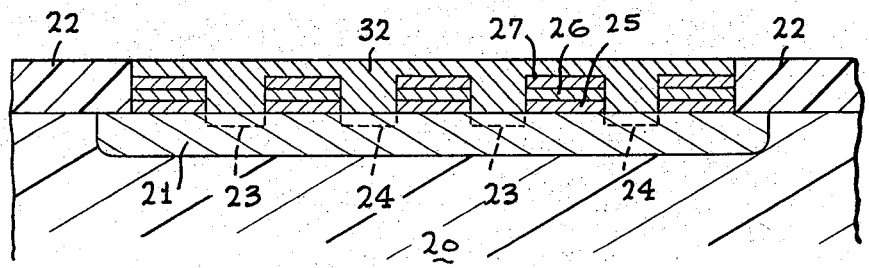
FIG. 1 is a diagrammatic side sectional view through a semiconductor device manufactured according to a process of the prior art, wherein a layer of polysilicon is deposited over and between deposits of silicon dioxide.
Figure 2:
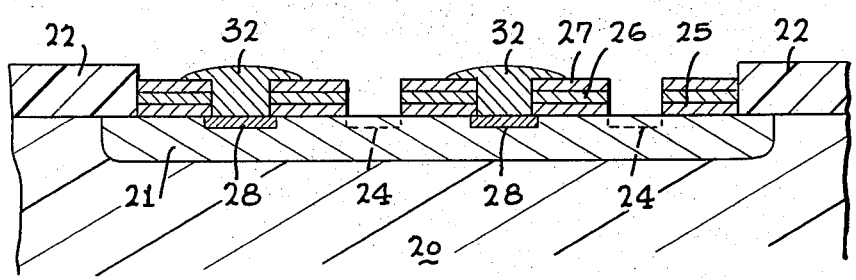
FIG. 2 is a diagrammatic side sectional view of the device of FIG. 1, wherein the polysilicon over base contact sites has been etched away and emitters have been diffused, all according to a prior art process.
Figure 3:
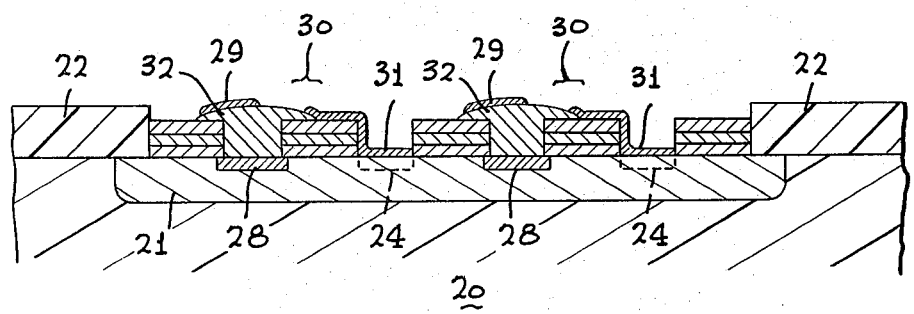
FIG. 3 is a side sectional view of the device shown in FIGS. 1 and 2, whereby the metallization process of the prior art has caused an electrical short between the emitter and base of the device.

Advantages and benefits of the herein disclosed inventive processes are best appreciated when compared to processes used in the prior art. Accordingly, FIGS. 1 through 3 illustrate a prior art process for manufacturing semiconductor devices, whereas FIGS. 4 through 7 illustrated one embodiment of the inventive process. It should be noted that none of the Figures are to scale, but only represent in a diagrammatic manner the effects of the described processes.

FIG. 1 illustrates the effect of certain prior art semiconductor manufacturing processes when performed on a semiconductive substrate or wafer 20. A base region 21 is formed in the wafer 20 by a process such as diffusing an appropriate conductivity-determining impurity into the wafer 20. The base region 21 may be determined by a masking oxide 22, which limits the area of the wafer exposed to the base diffusion process. As is well known in the industry, during such a base diffusion process, typically a layer of silicon dioxide 25 is formed concurrently. A layer of silicon nitride 26 is then formed over the base region 21. Next, a layer of silicon dioxide 27 is then formed over the layer of silicon nitride. The layers over the base region are then masked and etched to open up areas of the base region which will be used as emitter sites 23 and base contact sites 24. A layer of polysilicon 32 is then deposited over the wafer 20, forming a semiconductor device as is diagrammatically illustrated in FIG. 1. This polysilicon layer 32 may be appropriately "doped" when deposited to serve as the subsequent emitter diffusion source, or it may be undoped when deposited but later doped by diffusion or ion implant steps, as discussed below.

Next, the polysilicon overlaying the emitter sites 23 are masked to protect them from a subsequent etching operation which removes the polysilicon over the designated base contact sites 24. The mask used to protect the polysilicon overlaying the emitter sites also protects a portion of the polysilicon above the silicon nitride-silicon dioxide layers. This is caused by the limitations in the accuracy of registration of this second mask with respect to the initial mask which originally formed the polysilicon islands.

Conductivity-determining impurities, introduced into the polysilicon overlying the emitter sites 23, are then diffused into the base region by application of heat to the device, thereby forming an emitter diffusion 28, as illustrated in FIG. 2.

Subsequent metallization steps of masking and etching to allow electrical contact to be made to the emitter and base region are performed to form an emitter conductor 29 and base conductor 31. The mask used in the metallization process may suffer some misregistration with respect to the mask used to define the base contact sites and emitter sites. Accordingly, as indicated in FIG. 3, a base region conductor 31 may partially cover the silicon dioxide which separates an emitter site and base contact site. If the base conductor 31 is sufficiently misregistered as to contact the polysilicon overlaying an adjacent emitter site 23, an emitter-base short 30 will result. It is this emitter-base short 30 which is sought to be prevented by the herein disclosed inventive processes.

In summary, this type of short is caused by the fact that the polysilicon overlaying an emitter site partially "crosses" the silicon dioxide which separates the polysilicon from a base contact site. In addition, the metallization masking process may allow the electrical conductor contacting the base region, to also overlay the separating silicon dioxide, resulting in an undesired short.

The inventive process, illustrated in FIGS. 4 through 7, determines the precise extent of a polysilicon island over an emitter site by the initial masking operation. This serves to maximally separate an emitter site and nearby base contact region, reducing the likelihood of a short.

FIG. 4 is a diagrammatic sectional view through a semiconductive device which is being processed in the inventive manner. Upon a substrate or wafer 20, a base region masking oxide 22 has defined a base region 21 which may be formed by diffusing a conductivity-determining impurity into the wafer 20. Any silicon dioxide formed over the base region 21 during its formation is removed by methods well known in the industry. Over the base region 21 is deposited a layer of polysilicon 32. Over the polysilicon 32 is placed a protective covering 33.

The protective covering 33 must be able to be controllably etched to create a mask over designated portions of the base region 21 which will be used for emitter sites 23 and base contact sites 24. The protective coating 33 must be able to protect the polysilicon 32 underlaying it during a silicon dioxide-forming step to be described below. In one embodiment of the invention, the protective layer 33 is formed by depositing a layer of silicon nitride over the polysilicon 32 and etching it appropriately in a manner well-known in the industry to expose the underlying polysilicon 32 not over the designated emitter sites 23 and base contact areas 24.

The silicon nitride layer 26 may be etched in several ways. For instance, a layer of silicon dioxide 27 may be deposited over the silicon nitride. In one embodiment, the silicon dioxide deposited was formed from tetraethyl-ortho silicate, although other methods to form the silicon dioxide would be equally suitable. The advantage of such a deposited silicon dioxide layer is that it may easily etched via standard photoresist masking and etching techniques to form a suitable mask over the silicon nitride, which itself may then be etched by phosphoric acid or other such silicon nitride etches to form the desired protective coating 33.

It should be understood that other well known methods for forming a protective coating are equally encompassed by the invention. For instance, certain plasma etching techniques do not require a deposited oxide to protect silicon nitride during its etching since a simple mask of photoresist would be sufficient.

In any event, a protective coating 33 is formed over the polysilicon layer 32. In one embodiment, the polysilicon layer 32 is etched wherever it is not protected by the protective coating 33. After such an etching process, the semiconductor device may appear as illustrated in FIG. 5. In distinction to prior art methods for manufacturing such devices, the polysilicon overlaying each emitter site 23 has been precisely located by this initial masking operation. The island 34 of polysilicon overlying an emitter site 23 or base contact site 24 has not been formed by the placing of polysilicon into an exposed area over the base region 21, but rather has been formed by removing polysilicon not over the desired site.

After the formation of polysilicon islands 34, the exposed portions of the wafer may be oxidized to form silicon dioxide 27 around the polysilicon islands 34. The protective coating 33 over the polysilicon islands prevents them from being oxidized. To maintain planarity of the layers over the base region, it is desirable to form the silicon dioxide in a thickness approximating the thickness of the polysilicon islands.

In such a manner, polysilicon islands over the emitter sites 23 and base contact sites 24 are formed, with silicon dioxide surrounding the formed polysilicon islands 34. Although the formation of such a configuration has been described in this embodiment by the forming of a protective coating, etching away of the undesired polysilicon, and forming silicon dioxide layer around the islands, other methods for forming such a configuration will be apparent to those skilled in the art. For instance, a protective coating of silicon nitride over the portions of the polysilicon which will constitute the islands may be used to protect that polysilicon while the exposed polysilicon is "anodized" in an electrolytic hydrofluoric solution, which creates a high degree of porosity in the unprotected polysilicon. When subjected to heat, the unprotected, anodized polysilicon will readily oxidize, forming the desired configuration. In such an embodiment of the inventive process, the desired configuration is formed by "converting" the undesired polysilicon to silicon dioxide, rather than etching it away and forming the silicon dioxide directly in the exposed regions. In any event, the result is the same: islands 34 of polysilicon directly over the desired base contact 24 and emitter 23 sites, the islands being surrounded by silicon dioxide 27 to form a suitable dielectric separation between the sites 23, 24.

The protective coating 33 may then be removed by methods well-known in the industry. For instance, the remaining silicon nitride, if such was used to form the protective coating, may be readily etched by use of chemicals well-known in the industry. After the removal of the protective layer, a device as illustrated in FIG. 6 has been formed.

The next series of steps is concerned with removing the polysilicon islands over base contact sites 24 without affecting the emitter site islands and separating silicon dioxide. One manner to perform this is to create a mask of deposited silicon dioxide or photoresist over the emitter site polysilicon islands, and, using a selective polysilicon etch, to remove the unprotected base contact polysilicon islands without affecting the protected emitter site islands. Chemical etching, plasma etching, or other such etching techniques well-known in the industry which can selectively etch polysilicon, without adversely affecting silicon dioxide, will perform the desired function.

Whatever desired mask material is used in this second masking step, is then removed. It should be noted, that unlike prior art methods, this second masking step is not highly critical. In forming this mask over the emitter site polysilicon islands, it may overlap the silicon dioxide surrounding the emitter islands without causing any deleterious effects. Therefore, the tolerance on the registration of this mask with respect to the earlier masking operation which formed the polysilicon islands 34 is relatively uncritical, since the mask may be of such "width" as to encompass the surrounding silicon dioxide, so long as the emitter site islands are protected and the base contact area islands are exposed.

After the removal of the polysilicon islands overlaying the basic contact sites, the emitters are formed. By appropriate heating of the device, a conductivity-determining impurity from the polysilicon is diffused into the underlying base region 21, forming an emitter diffusion region 28. As is well known in the industry, an element from Group III and V of the Periodic table such as arsenic, boron, and phosphorus, when diffused into a semiconductor such as silicon, is able to form a semiconductive region of a specific conductivity type, the type depending on what group the element belongs to.

There are several methods for assuring that the polysilicon island overlying an emitter site 23 contains an appropriate concentration of an appropriately defined conductivity-determining impurity. In one embodiment, the polysilicon layer which was initially deposited 32, contained the desired concentration of the emitter-forming impurity. In such embodiment, before the emitter is desired to be diffused, each step requiring heating of the device, must be at a sufficiently low temperature, e.g., 800 degrees Celsius or below so as not to cause diffusion of the impurity from a base contact polysilicon island into the underlaying base region.

In another embodiment of the inventive process, after the polysilicon layer 32 is deposited, and before the polysilicon islands overlaying the base contact sites 24 are removed, the desired emitter-type impurity may be placed in the emitter site polysilicon islands by a process such as ion implanting. After removal of the base contact polysilicon islands, the emitter diffusion area 28 may be formed by heating the device to cause the impurity to diffuse into the emitter site 23. Use of the ion implant technique offers certain advantages. For instance, a polysilicon island overlaying an emitter site 23 has a resistance which may be profitably utilized, e.g., as an emitter ballast resistor, under certain circumstances. The value of this resistance may be more easily controlled by use of the ion implant technique. Where an impurity-containing layer of polysilicon 32 is originally deposited, the eventual resistance value of the emitter site polysilicon islands is not as readily controlled.

After creating the emitter diffusion regions 28, the forming of ohmic contacts and forming of suitable electrical conductors 23 to the emitter and base regions 21 are formed. In one embodiment, platinum is sputtered, evaporated, or otherwise deposited on the wafer surface. By subsequent heating of the device in the range of 400 degrees to 700 degrees Celsius, platinum silicide is formed in the exposed base contact regions 24 and exposed portions of the polysilicon islands overlaying emitter diffusions 28, creating the desired ohmic contact. Subsequent metalization processes, by means well-known in the industry, are then performed to create the desired electrical connection of the base contact 24 and emitter region 28. After such metalization, a device as illustrated in FIG. 7 has been manufactured. At this point, the advantages of the hereindisclosed inventive processes are most readily ascertainable. A misregistration of the metalization is illustrated in FIG. 7. The results of processes used in the prior art are illustrated in FIG. 3. Since the emitter site polysilicon islands formed by the inventive process have been precisely defined by the initial masking operation, they do not "mushroom" over the top of the separating silicon dioxide. Accordingly, the width of the dielectric silicon dioxide separates an emitter site polysilicon island from an adjacent base contact region to prevent short 30' from occurring. Accordingly, much greater misregistrations during the metalization step may occur, without causing the undesired emitter-base shorts found in prior art devices.

While only a limited number of embodiments of the disclosed inventive process have been discussed herein, it will be readily apparent to persons skilled in the art that certain changes and modifications may be made without departing from the spirit of the invention. Accordingly, the foregoing disclosure, description, and Figures are for illustrative purposes only, and do not in any way limit the invention, which is defined only by the claims.

I claim:

1. A process for forming a semiconductive electronic translation device comprising the steps of:
   forming a base region on a semiconductive silicon wafer;
   depositing a polysilicon layer over said base region;
   forming a protective covering on said polysilicon layer directly over selected closely spaced sites of said base regions, said sites including plural sites for making an electrical contact with said base region and plural emitter sites;
   replacing the polysilicon not under said protective covering with silicon dioxide;
   removing the polysilicon over said base contact sites to expose portions of the base region; and
   diffusing a conductivity-determining impurity previously placed in the polysilicon overlaying said emitter sites into said base region to form emitter regions within said base region.

2. A process according to claim 1 including the additional steps of:
   forming ohmic contacts on said base contact sites and on the polysilicon overlaying said emitter sites; and
   forming electrically conductive paths to said ohmic contacts.

3. A process according to claim 1 wherein said protective covering comprises a layer of silicon nitride.

4. A process according to claim 3 wherein above said silicon nitride is deposited silicon dioxide.

5. A process according to claim 1 wherein said step of forming said protective covering comprises the steps of:
   depositing a layer of silicon nitride over said polysilicon layer;
   depositing a layer of silicon dioxide over said silicon nitride layer; and
   applying a mask of photoresist over said selected sites.

6. A process according to claim 1 wherein said step of replacing comprises the steps of:
   removing polysilicon not under said protective covering to expose other portions of said base region; and
   oxidizing said exposed other portions to form silicon dioxide.

7. A process according to claim 1 wherein said step of replacing comprises the steps of:
   anodizing in an electrolytic hydrofluoric solution said polysilicon layer not under said protective coating; and
   oxidizing said anodized polysilicon to form silicon dioxide.

8. A process according to claim 7 wherein said oxidizing is performed at a temperature below 800 degrees Celsius.

9. A process according to claim 1 wherein the polysilicon contains said conductivity-determining impurities when it is deposited.

10. A process according to claim 1 wherein after said step of depositing and before said step of diffusing, said conductivity-determining impurity is ion-implanted into the polysilicon overlaying said emitter site.

11. A process according to claim 1 wherein said conductivity-determining impurity is a member from the group comprising arsenic, phosphorus, and boron.

12. A process according to claim 1 wherein the step of forming said protective covering comprises the steps of:
   depositing a layer of silicon nitride over said polysilicon layer;
   applying a mask of photoresist on said silicon nitride layer over said selected sites; and
   plasma etching said silicon nitride not under said mask.

* * * * *